(12) United States Patent
Ohno

(10) Patent No.: US 8,198,187 B2
(45) Date of Patent: Jun. 12, 2012

(54) MANUFACTURING METHOD OF SEMICONDUCTOR DEVICE

(75) Inventor: Yasuyoshi Ohno, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 156 days.

(21) Appl. No.: 12/659,191

(22) Filed: Feb. 26, 2010

(65) Prior Publication Data
US 2010/0221908 A1    Sep. 2, 2010

(30) Foreign Application Priority Data
Feb. 27, 2009   (JP) .................................. 2009-046044

(51) Int. Cl.
*H01L 21/44*    (2006.01)
(52) U.S. Cl. ....................................... 438/613; 257/774
(58) Field of Classification Search .................. 438/626, 438/613
See application file for complete search history.

(56) References Cited

U.S. PATENT DOCUMENTS
2003/0132443 A1*  7/2003  Kim .................................. 257/79

FOREIGN PATENT DOCUMENTS
JP          09-232307 A       9/1997
* cited by examiner

*Primary Examiner* — Thao Le
*Assistant Examiner* — Kimberly Trice
(74) *Attorney, Agent, or Firm* — Rabin & Berdo, P.C.

(57) ABSTRACT

Disclosed is a method of manufacturing a semiconductor device that does not have a defect, such as wire breakage, due to an uplifted portion created at a rewiring pattern in a multilayer wire structure. Before a wiring layer is formed on an insulation layer, the insulation layer is exposed via a mask. The mask has a weak exposure part and a strong exposure part. The mask is positioned such that the weak exposure part corresponds to an arrangement position of a wire line of an underlying wiring layer, and such that the strong exposure part corresponds to an arrangement position of a via part of the underlying wiring layer. The underlying wiring layer is a layer immediately below the insulation layer.

18 Claims, 5 Drawing Sheets

MANUFACTURING METHOD OF SEMICONDUCTOR DEVICE

BACKGROUND OF THE INVENTION

1. Field of the Invention

The present invention relates to a method of manufacturing a semiconductor device constructed in a multilayer wiring structure. Insulation layers and wiring layers are alternately stacked in this wiring structure.

2. Description of the Related Art

Wafer level size packages are developed to answer demands for downsizing and thickness-reducing. One example of the multilayer wiring structure is shown in FIG. 1 of the accompanying drawings. This structure is adopted in a large majority of wafer level size packages. One typical way of manufacturing a multilayer-wiring-structure wafer level size package is described with reference to FIG. 1. First, a metal pad 220 is placed on a semiconductor substrate 210, and an insulation layer 230 is formed over the semiconductor substrate 210. That portion of the insulation layer 230 which corresponds to a via part V1 on the metal pad 220 is removed. An underlying metal layer is formed on the insulation layer 230 by sputtering, and then a wiring layer 240 is formed on the underlying metal layer by electroplating. Another insulation layer 250 is formed on the wiring layer 240. Those portions of the insulation layer 250 which correspond to the first via part V1 and a second via part V2 are removed. Another underlying metal layer is formed on the insulation layer 250 by sputtering, and then second wiring layers 260 and 261 are formed on the underlying metal layer by electroplating. These processes are repeatedly carried out to manufacture a semiconductor package having a multilayer wiring structure.

SUMMARY OF THE INVENTION

When manufacturing a semiconductor package of a multi-wiring-layer structure by the above-described conventional technology (FIG. 1), a step (or slope or uplifted portion) ST may be formed at the wiring layer 260, as shown in FIG. 1. As a result, a wiring pattern formed over the step ST of the wire layer 260 may be damaged at the step portion ST. For example, electrical disconnection may occur at or in the vicinity of the step portion ST.

Japanese Patent Application Kokai (Publication) No. 9-232307 discloses a method of forming a flat insulation film over a substrate having a step portion. However, this method is not suited for the multi-wiring-layer structure. This conventional method cannot form an insulation film based on the arrangement of via parts interconnecting a plurality of wiring patterns formed at (on, in) different wiring layers.

One object of the present invention is to provide a manufacturing method of a semiconductor device that has a multi-wiring-layer structure such that the resulting semiconductor device will not have a defect, such as wire breakage or disconnection, due to a step or uplifted portion formed at a particular wiring pattern in the multi-wiring-layer structure.

According to one aspect of the present invention, there is provided an improved manufacturing method of a semiconductor device. The semiconductor device has a plurality of insulation layers and a plurality of wiring layers alternately stacked on a semiconductor substrate. The semiconductor device also has at least one via part. The insulation layers include at least a first insulation layer and a second insulation layer. The second insulation layer is located (or extends) above the first insulation layer. The wiring layers include at least a first wiring layer and a second wiring layer. The first wiring layer is provided between the first and second insulation layers. The second wiring layer is provided on the second insulation layer. The first wiring layer has a wiring line. At least one via part includes a first via part providing electrical conduction between the first and second wiring layers. The manufacturing method includes preparing the semiconductor substrate. The manufacturing method also includes preparing a mask that has a weak exposure part and a strong exposure part. The strong exposure part transmits more light than the weak exposure part. The manufacturing method also includes providing the first insulation layer. The manufacturing method also includes providing the first wiring layer on the first insulation layer. The manufacturing method also includes providing the second insulation layer on the first wiring layer. The manufacturing method also includes placing the mask over the second insulation layer such that the weak exposure part is positioned above an arrangement position of the wiring line of the first wiring layer, and the strong exposure part is positioned above an arrangement position of the first via part. The manufacturing method also includes exposing the second insulation layer via the mask. The exposing light is for example a laser beam. The exposing light transmits the weak exposure part and the strong exposure part. The light passing through the weak exposure part is weakened by the weak exposure part so that the weakened light (weak exposure light) reaches the second insulation layer. The light passing through the strong exposure part is also weakened by the strong exposure part, but less weakened if compared with the light passing through the weak exposure part, so that the less weakened light (or stronger exposure light) reaches the second insulation layer. The manufacturing method also includes providing the first via part. The manufacturing method also includes forming the second wiring layer on the second insulation layer.

This semiconductor device manufacturing method can manufacture a semiconductor device which does not have a defect, such as wire breakage, due to an uplifted portion created at a rewiring pattern (second wiring layer) in a multilayer wiring structure.

In one embodiment, the weak exposure part may have a plurality of openings and the strong exposure part may have a sole opening. The opening of the weak exposure part may be a plurality of slits arranged in parallel. Alternatively, the opening of the weak exposure part may be arranged in a matrix.

In another embodiment, the weak exposure part may have a plurality of openings, and the strong exposure part may also have a plurality of openings, but the openings of the strong exposure part may be larger than the openings of the weak exposure part.

The second insulation layer may have at least one uplifted portion that is created due to the wire line of the first wiring layer. The exposure light passing through the weak exposure part of the mask may be irradiated to the uplifted portion.

The manufacturing method may further include developing the second insulation layer after the exposing of the second insulation layer and before the forming of the second wiring layer in order to remove the uplifted portion from the second insulation layer and to form a via hole for the first via part.

The manufacturing method may further include providing an electrode post on the uppermost wiring layer, providing a sealing material over the uppermost wiring layer and the electrode post, and providing an electrode terminal on the electrode post.

The providing of the first via part may be carried out simultaneously with the forming of the second wiring layer.

These and other objects, aspects and features of the present invention will become apparent to those skilled in the art from the following detailed description when read and understood in conjunction with the appended claims and drawings.

DETAILED DESCRIPTION OF THE INVENTION

Now, an exemplary embodiment of the present invention will be described in detail with reference to the accompanying drawings.

Referring to FIGS. 2A to 2C and FIGS. 5A to 5C, a manufacturing method of a semiconductor device 1 having a multilayer wiring structure according to an embodiment of the present invention will be described. The manufacturing method proceeds in order from FIGS. 2A-2C to FIGS. 5A-5C.

Figure 1:
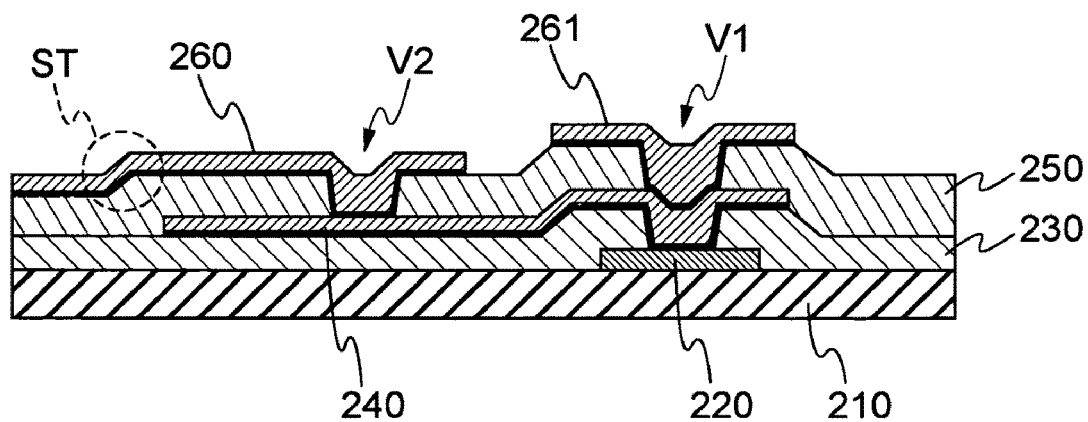
FIG. 1 is a cross-sectional view of a conventional semiconductor package having a multilayer wiring structure.
Figure 2A:
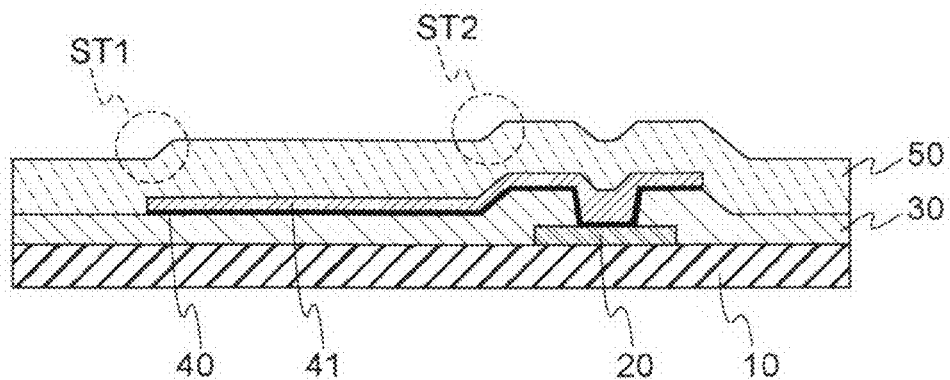
FIGS. 2A to 2C are a series of cross-sectional views, illustrating three steps of a manufacturing method according to one embodiment of the present invention.

First, as shown in FIG. 2A, a semiconductor substrate 10 is prepared. The semiconductor substrate 10 is made of, for example, silicon. On the substrate 10, there is provided a metal pad 20, made of, for example, aluminum.

A photosensitive first insulation film 30 is formed on the semiconductor substrate 10, for example, by spin coating. The first insulation film 30 may be a positive-type polyimide-based coating agent. The first insulation film 30 has a film thickness of, for example, 10 μm. Subsequently, the portion of the first insulation film 30 corresponding to the metal pad 20 is removed by a normal exposure and development process. After that, the first insulation film 30 is hardened at a temperature of, for example, 180 to 250° C. (degrees C.).

A first underlying metal film 40 is formed on the first insulation film 30 by sputtering. The first underlying metal film 40 is made of, for example, titanium or copper. A first metal wiring layer having a layer thickness of, for example, 10 μm is formed over a region extending from the portion of the first underlying metal film 40 corresponding to the metal pad 20 to a predetermined position, for example, by electroplating. After that, an unnecessary portion of the first underlying metal film 40 is removed to form a first metal wiring line 41. The wire length and wire width of the first metal wire line 41 may be decided on the basis of various factors. The wire width of the first metal wire line 41 is, for example, 70 μm, and the wire length of the first metal wire line 41 is, for example, 1 mm to 500 mm.

A photosensitive second insulation film 50 is formed on the first insulation film 30 and the first metal wire line 41. The second insulation film 50 may be made from a positive-type polyimide-based coating agent. The second insulation film 50 has a film thickness of, for example, 10 μm. At this time, it should be assumed that steps ST1 and ST2 corresponding to the cross-sectional shape (or contour) of the first underlying metal film 40 having uplifted portions are formed on the second insulation film 50.

Figure 2B:
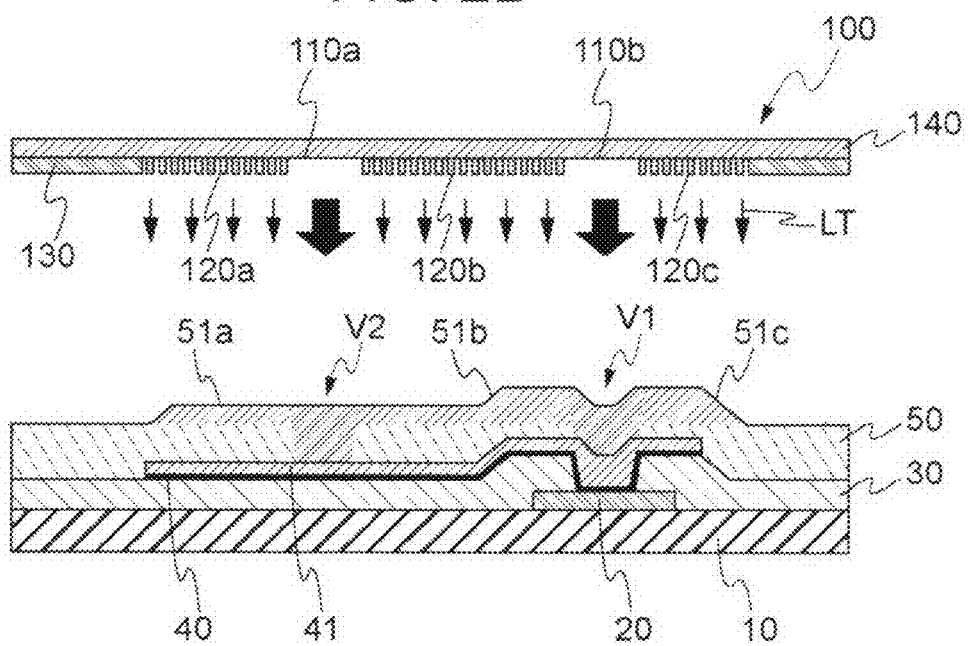

As shown in FIG. 2B, exposure light LT from an ArF excimer laser having a wavelength of, for example, 193 nm, is irradiated to the second insulation film 50 via a mask 100. The mask 100 has a base element 140, strong exposure parts 110a and 110b, weak exposure parts 120a, 120b and 120c, and a shield part 130. The weak exposure parts 120a-120c, strong exposure parts 110a, 110b and shield part 130 are attached to the base element 140. The base element 140 is light-transmissive.

The strong exposure part 110a is a single opening formed at a position corresponding to a via part V2. The other strong exposure part 110b is a single opening formed at a position corresponding to another via part V1. When the mask 100 is placed above the second insulation layer as shown in FIG. 2B, the light LT is irradiated to the second insulation film 50 through the strong exposure parts 110a and 110b without being shielded (as indicated by the thick black arrows in FIG. 2B). The amount of exposure to the portions of the second insulation film 50 corresponding to the strong exposure parts 110a and 110b is, for example, 150 mJ/cm$^2$.

The weak exposure parts 120a, 120b and 120c are provided at positions corresponding to uplifted portions 51a, 51b and 51c, respectively. The uplifted portions 51a, 51b and 51c are those portions of the second insulation film 50 which protrude as a result of forming the first metal wire line 41 excluding the portions corresponding to the via parts V1 and V2. Each of the weak exposure parts 120a, 120b and 120c is an opening group consisting of a plurality of openings, having a smaller size than the openings of the strong exposure parts 110a and 110b. These small openings of each weak exposure part 120a, 120b, 120c are disposed at relatively high density. The irradiation light LT is weakened by the weak exposure parts 120a, 120b and 120c, and the weakened light LT (as indicated by the thin arrows in FIG. 2B) is irradiated to the second insulation film 50. The amount of exposure to those portions of the second insulation film 50 corresponding to the protuberances 51a, 51b and 51c is, for example, 70 mJ/cm$^2$. Thus, the amount of light transmitted through the weak exposure parts 120a, 120b and 120c per unit area, i.e., the light transmissivity of the weak exposure parts 120a, 120b and 120c, is less than the light transmissivity of the strong exposure parts 110a and 110b.

The shield part 130 is provided at a position corresponding to neither the first metal wire line 41 nor the via parts V1 and V2. The irradiation light LT is shielded by the shield part 130. The irradiation light LT is not transmitted to those portions of the second insulation film 50 corresponding to the shield part 130.

As described above, the mask 100 decides light transmission distribution corresponding to the arrangement/position of the first metal wire line 41 formed immediately below the second insulation film 50 and to the arrangement/positions of the via parts V1 and V2.

Figure 3:
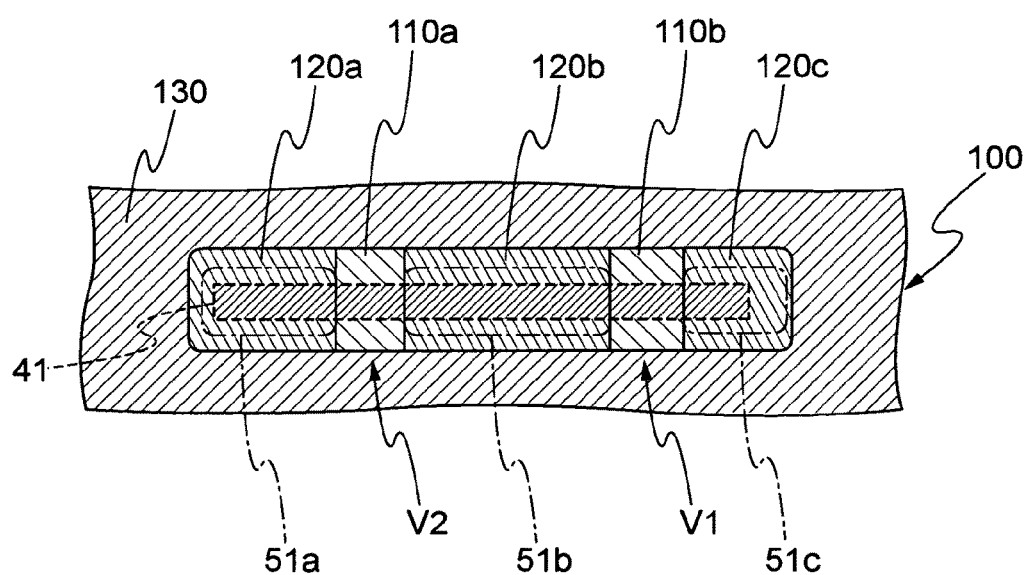
FIG. 3 is a plan view illustrating a mask, a wire, and via parts, which overlap one another, when viewed from above.

FIG. 3 is a plan view illustrating the mask 100, the first metal wire line 41, the protuberances 51a, 52b and 51c, and the via parts V1 and V2, which overlap one another. The first strong exposure part 110a corresponds to (overlaps) the second via part V2, and the second strong exposure part 110b corresponds to the first via part V1. The three weak exposure parts 120a, 120b and 120c correspond to (overlaps) the three protuberances 51a, 51b and 51c, respectively. The shield part 130 extends in the remaining area, i.e., an area corresponding to neither the first metal wire line 41 nor the via parts V1 and V2. It should be noted that there are provided a plurality of first metal wire lines 41 on the first insulation film 30 although only one of them is illustrated. Thus, the strong exposure parts 110a, 110b and weak exposure parts 120a, 10b, 120c are formed in the mask 100 for each of the first metal wire lines 41.

Figure 4A:
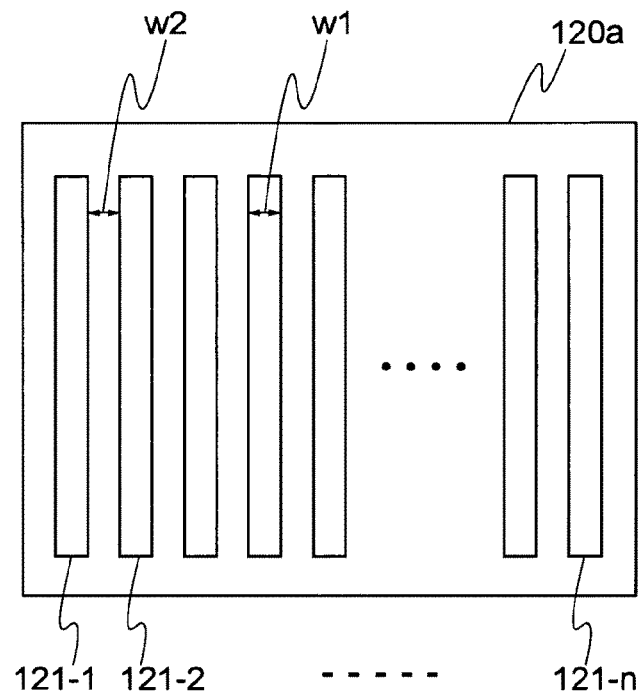
FIG. 4A is a plan view of the mask.

FIG. 4A illustrates the detail of the weak exposure part 120a. The weak exposure part 120a has a plurality of openings (opening group). These openings are slits 121-1 to 121-n (n is an integer not less than 2). Each slit 121-i has a slit width w1. The slits 121-1 to 121-n are arranged in parallel in the width direction of the mask 100 at predetermined intervals (slit intervals) w2. The size of each slit 121-i is smaller than that of the opening of the strong exposure part 110a (or 110b). Since the laser beam LT is blocked by those portions of the weak exposure part 120a except for the slits 121-1 to 121-n, an amount of exposure under the weak exposure part 120a is reduced (less than the exposure under the strong exposure part 110a, 110b). The light transmissivity of the weak exposure part 120a is therefore smaller than the light transmissivity of the strong exposure part 110a, 110b.

The slit width w1 and the slit interval w2 may be decided on the basis of various factors. For example, the slit width w1 and the slit interval w2 may be decided depending on intensity and irradiation distance of the light source (ArF excimer laser). The slit width w1 may be 1 mm, and the slit interval w2 may also be 1 mm. It should be noted that the slits 121-1 to 121-n may have different slit widths. For example, the odd slits (first slit 121-1, third slit 121-3, fifth slit 121-5, . . . ) have a slit width w1 of 0.5 mm, and the even slits (second slit 121-2, fourth slit 121-4, . . . ) have a slit width w1 of 1 mm. It should also be noted that a thin film may be provided over each slit 121-i to further weaken the light transmissivity of the weak exposure part 120a. The thin film may be made from polyester.

Figure 4B:
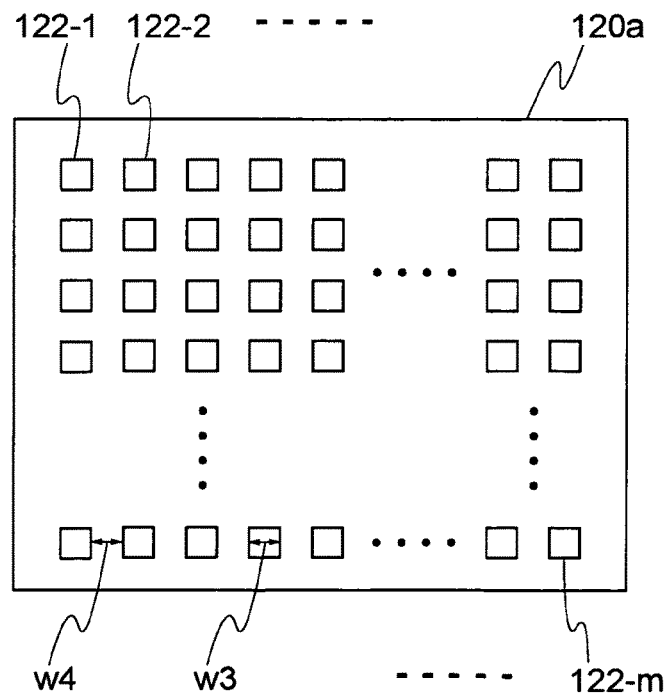
FIG. 4B is a plan of another example of the mask.

The weak exposure part 120a is not limited to the one shown in FIG. 4A. For example, as shown in FIG. 4B, the weak exposure part 120a may have a plurality of small square openings 122-1 to 122-m (m is an integer not less than 2) arranged in a matrix fashion. Each opening 122-i has a width w3. These openings are spaced from each other by predetermined intervals w4 (opening intervals). The size of each square opening 122-i is smaller than that of the opening of the strong exposure part 110a (or 110b). It should be noted that the shape of each opening 122-i is not limited to square. It may be a polygonal shape or a circular shape or any other suitable shape. It should also be noted that a thin film polyester sheet may be attached over each of the square opening 122-i to further weaken the transmission of the light LT through the weak exposure part 120a.

The second and third weak exposure parts 120b and 120c have the same construction as the first weak exposure part 120a in the illustrated embodiment. It should be noted, however, that the three weak exposure parts 120a, 120b and 120 may have different opening sizes and different opening densities and arrangements based on the cross-sectional shape or contour of the second insulation film 50.

It should be noted that the strong exposure part 110a may have a plurality of openings, like those as shown in FIG. 4A or 4B. In this configuration, however, the size of each opening in the strong exposure part 110a, 110b is greater than that of each opening in the weak exposure part 120a, 120b, 120c. the strong exposure part 110a, 110b has greater light transmissivity than the weak exposure part 120a, 120b, 120c.

As shown in FIG. 2B, the second insulation film 50 is exposed via the mask 100 so that those portions of the second insulation film 50 that correspond to the high transmissivity parts 110a and 110b of the mask 50 are exposed to a great depth. In other words, those portions of the second insulation film 50 that correspond to the via parts V1 and V2 are exposed to a great depth. On the other hand, those portions of the second insulation film 50 that correspond to the protuberances 51a, 51b and 51c are subjected to a low(er) amount of exposure, with the result that those portions of the second insulation film 50 are exposed to a shallower depth than the portions of the second insulation film 50 corresponding to the via parts V1 and V2. The light LT is blocked by the shield 130 so that the light does not reach the remaining portions of the second insulation film 50, i.e., the remaining portions of the second insulation film 50 are not influenced by the light LT.

Figure 2C:
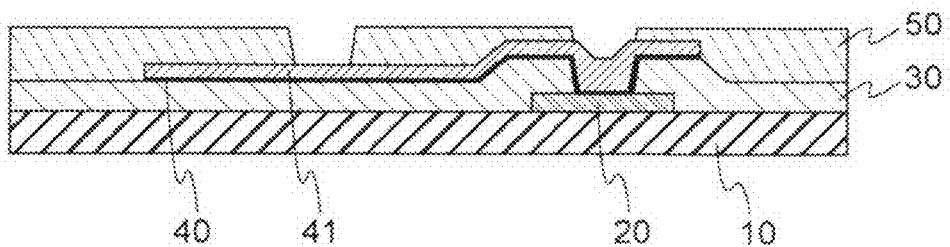

Subsequently, as shown in FIG. 2C, the positive type photosensitive second insulation film 50 is developed to remove the exposed portions of the second insulation film 50, i.e., the portions of the second insulation film 50 corresponding to the via parts V1 and V2 and the protuberances 51a, 51b and 51c. As a result, the surface of the second insulation film 50 is flattened. After that, the second insulation film 50 is hardened at a temperature of, for example, 180 to 250° C.

Figure 5A:
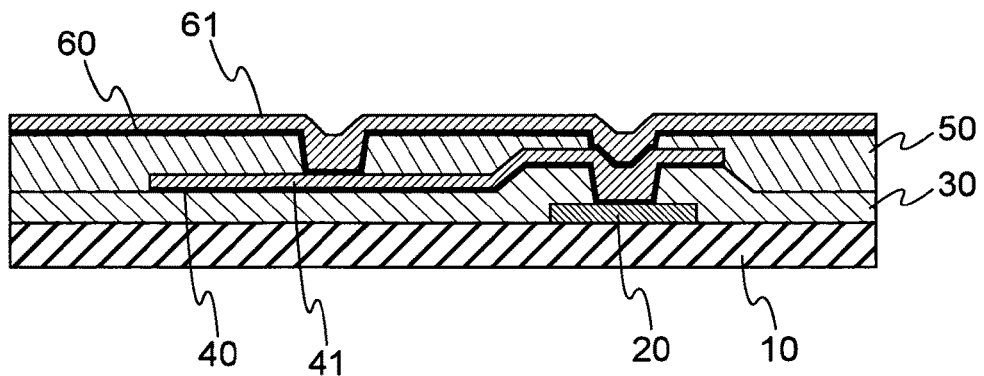
FIGS. 5A to 5C are a series of cross-sectional views illustrating subsequent steps of the manufacturing method after FIG. 2C

The manufacturing method after FIG. 2C will be described with reference to FIGS. 5A to 5C. As shown in FIG. 5A, a second underlying metal film 60 made of, for example, titanium or copper is formed on the second insulation film 50 by sputtering. A second metal wiring layer 61 having a layer thickness of, for example, 10 μm is formed on the second underlying metal film 60 by electroplating.

Figure 5B:
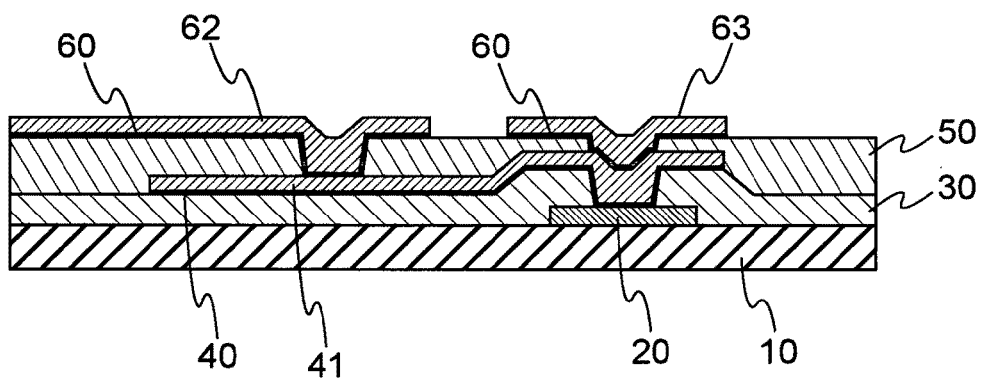

As shown in FIG. 5B, unnecessary portions of the second underlying metal film 60 and the wiring layer 61 are removed to form rewire lines, i.e., second metal wiring 62 and 63. The wire width of the second metal wiring 62, 63 is, for example, 70 μm, and the wire length of the second metal wire line 62, 63 is, for example, 1 mm to 500 mm. Since the surface of the second insulation film 50 is flattened before the second underlying metal film 60 is formed, no steps or uplifted portions are formed in the second metal wiring 62 and 63.

Figure 5C:
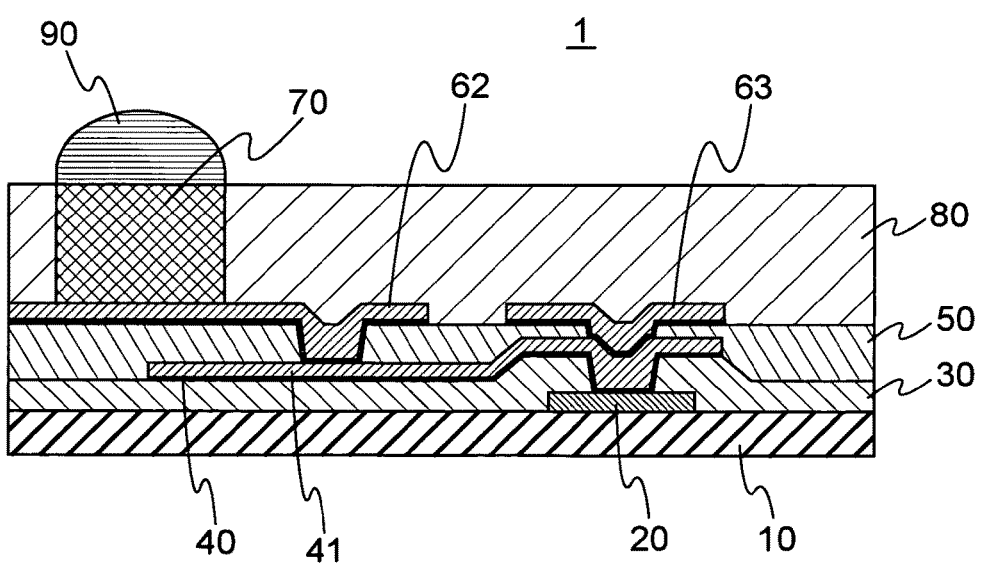

As shown in FIG. 5C, a post electrode 70 is formed on the second metal wiring 62 by electroplating. The material of the post electrode 70 is metal such as copper. The post electrode 70 has a cylindrical shape and its diameter is, for example, 500 μm. The surfaces of the second insulation film 50 and the second metal wire lines 62 and 63 are covered with an encapsulation or sealing resin 80. The resin 80 is for example epoxy resin. The surface of the encapsulation resin 80 is cut or ground by cutting or machining to expose an upper end of the post electrode 70. An electrode terminal 90, such as a solder ball, is formed on top of the post electrode 70. As a result, a semiconductor device 1 is manufactured.

It should be noted that the mask 100 is not limited to the one illustrated in FIG. 2B. For example, the mask 100 may not have the base element 140. The base element 140 supports the weak and strong exposure parts 120a, 120b, 110a, 110b and 110c in FIG. 2B, but the base element 140 may be dispensed with, and the shield part 130 may support the weak and strong exposure parts.

Also, the weak exposure parts 120a and 120b may have other structure. The weak exposure part 120a (120b) is the plate member having a plurality of openings 121 (or 122) in FIG. 4A (or FIG. 4B). Alternatively, the weak exposure part 120a is a solid plate having a smaller light-transmissivity. The strong exposure part 110a, 110b, 110c may also be a solid plate having a greater light-transmissivity. In short, the mask 100 may have any suitable structure as long as the mask 100 can provide two different light-transmissivity parts.

In the semiconductor device manufacturing method according to this embodiment, before the rewiring pattern is formed in the multilayer wire structure package, the insulation film is exposed via the mask having the unique light transmission distribution. This unique light transmission distribution is decided based on the arrangement position of the lower-layer wiring and the arrangement position of the via parts. Specifically, the insulation film is exposed via the mask including the weak exposure parts corresponding to the lower-layer wiring and the strong exposure parts corresponding to the via parts. Each of the weak exposure parts is an opening group consisting of a plurality of openings. The total amount of opening (or total amount of passing light) of each weak exposure part per unit area is smaller than that of the strong exposure part. Thus, the light transmissivity of the weak exposure parts is less than the light transmissivity of the strong exposure parts. The insulation film is exposed via the mask, and therefore it is possible to remove the portions of the insulation film corresponding to the via parts at the time of development and also possible to flatten the surface of the insulation film. Consequently, no uplifted portions are formed when the rewire pattern is formed, and therefore, it is possible to prevent the occurrence of defects, such as wire breakage, in the rewiring pattern.

Since the removing of those portions of the insulation film that correspond to the via parts and the flattening of the insulation film surface are achieved by exposing the insulation film via the single mask, the exposure process is simple. Also, the number of processes and costs are not increased. Therefore, it is possible to efficiently manufacture the semiconductor device that would never suffer from a defect, such as wire breakage, due to uplifted portions in the wiring pattern in the multilayer wire structure.

This is application is based on Japanese Patent Application No. 2009-46044 filed on Feb. 27, 2009 and the entire disclosure thereof is incorporated herein by reference.

What is claimed is:

1. A manufacturing method of a semiconductor device, the semiconductor device having a plurality of insulation layers and a plurality of wiring layers alternately stacked on a semiconductor substrate and at least one via part, said plurality of insulation layers including at least a first insulation layer and a second insulation layer, the second insulation layer being located above the first insulation layer, said plurality of wiring layers including at least a first wiring layer and a second wiring layer, the first wiring layer being provided between the first and second insulation layers, the second wiring layer being provided on the second insulation layer, the first wiring layer having a wiring line, the at least one via part including a first via part providing electrical conduction between the first and second wiring layers, the manufacturing method comprising:
preparing the semiconductor substrate;
preparing a mask that has a weak exposure part and a strong exposure part;
providing the first insulation layer;
providing the first wiring layer on the first insulation layer;
providing the second insulation layer on the first wiring layer such that an upper surface of the second insulation layer has at least one protuberance;
placing the mask over the second insulation layer such that the weak exposure part is positioned above an arrangement position of the wiring line of the first wiring layer, and the strong exposure part is positioned above an arrangement position of the first via part;
exposing the second insulation layer via the mask such that first portions of the second insulation layer are exposed through the weak exposure part of the mask and second portions of the second insulation layer are exposed through the strong exposure part of the mask;
developing the second insulation layer to remove the at least one protuberance, thereby flattening the upper surface of the second insulation layer except for the second portions of the second insulation layer;
providing the first via part; and
forming the second wiring layer on the second insulation layer.

2. The manufacturing method according to claim 1, wherein the weak exposure part has an opening group consisting of a plurality of openings having a predetermined size.

3. The manufacturing method according to claim 2, wherein the plurality of openings of the weak exposure part are a plurality of slits arranged in parallel.

4. The manufacturing method according to claim 2, wherein the plurality of openings of the weak exposure part are arranged in a matrix.

5. The manufacturing method according to claim 1, wherein the strong exposure part has an opening group consisting of a plurality of openings having a predetermined size.

6. The manufacturing method according to claim 1, wherein the second insulation layer has at least one uplifted portion that is created due to the wire line of the first wiring layer, and the exposure light passing through the weak exposure part of the mask is irradiated to the uplifted portion.

7. The manufacturing method according to claim 6, further comprising developing the second insulation layer after said exposing of the second insulation layer and before said forming of the second wiring layer in order to remove the uplifted portion from the second insulation layer and to form a via hole for the first via part.

8. The manufacturing method according to claim 1, wherein the mask includes a plate member, and the weak exposure part and strong exposure part are attached to the plate member.

9. The manufacturing method according to claim 1, wherein the strong exposure part has a sole opening.

10. The manufacturing method according to claim 1, wherein the strong exposure part transmits more light per unit area than the weak exposure part.

11. The manufacturing method according to claim 1, further comprising, after said forming of the second wiring layer, providing an electrode post on the uppermost wiring layer, providing a sealing material over the uppermost wiring layer and the electrode post, and providing an electrode terminal on the electrode post.

12. A manufacturing method of a semiconductor device, the semiconductor device having at least a first insulation layer, a first wiring layer, a second insulation layer, a second wiring layer stacked on a semiconductor substrate and at least a first via part and a second via part, the first wiring layer having a wiring line, the first and second via parts providing electrical conduction between the first and second wiring layers, the manufacturing method comprising:
preparing the semiconductor substrate;
preparing a mask that has a shield part, a first light transmitting part and a second light transmitting part, said second light transmitting part being adapted to transmit more light per unit area than said first light transmitting part;
providing the first insulation layer on the semiconductor substrate;
providing the first wiring layer on the first insulation layer;
providing the second insulation layer on the first wiring layer such that an upper surface of the second insulation layer has at least one protuberance;
placing the mask over the second insulation layer such that said first light transmitting part is positioned above an arrangement position of the wiring line of the first wiring layer, said second light transmitting part is positioned above an arrangement position of the first and second via parts, and said shield part is positioned above a remaining area of the second insulation layer;

exposing the second insulation layer via the mask such that first portions of the second insulation layer are exposed through the first light transmitting part of the mask and second portions of the second insulation layer are exposed through the second light transmitting part of the mask;

developing the second insulation layer to remove the at least one protuberance, thereby flattening the upper surface of the second insulation layer except for the second portions of the second insulation layer;

providing the first and second via parts; and forming the second wiring layer on the second insulation layer.

13. The manufacturing method according to claim 12, wherein the first light transmitting part of the mask has a plurality of openings and the second light transmitting part of the mask has a sole opening.

14. The manufacturing method according to claim 13, wherein the plurality of openings of the first light transmitting part are a plurality of slits arranged in parallel.

15. The manufacturing method according to claim 13, wherein the plurality of openings of the first light transmitting part are arranged in a matrix.

16. The manufacturing method according to claim 13, wherein the first light transmitting part of the mask has a plurality of first openings, the second light transmitting part has a plurality of second openings, and the total opening amount of the second openings is greater than that of the first openings.

17. The manufacturing method according to claim 12, wherein the second insulation layer has at least one uplifted portion that is created due to the wire line of the first wiring layer, and the exposure light passing through the first light transmitting part of the mask is irradiated to the uplifted portion.

18. The manufacturing method according to claim 17, further comprising developing the second insulation layer after said exposing the second insulation layer and before said forming the second wiring layer in order to remove the uplifted portion from the second insulation layer and to form a via hole for the first via part.

* * * * *